United States Patent
Zojceski et al.

(10) Patent No.: US 9,829,165 B2
(45) Date of Patent: Nov. 28, 2017

(54) LED SUPPORT WITH WIRE-BONDED ELECTRICAL CONNECTION FOR A LIGHTING MODULE OF A MOTOR VEHICLE AND ELECTRICAL CONNECTOR BY WIRE-BONDING

(71) Applicant: Valeo Vision, Bobigny (FR)

(72) Inventors: Zdravko Zojceski, Courbevoie (FR); Marc Duarte, Villemomble (FR); Denis Lauvernier, Vitry sur Seine (FR)

(73) Assignee: Valeo Vision, Bobigny (FR)

( * ) Notice: Subject to any disclaimer, the term of this patent is extended or adjusted under 35 U.S.C. 154(b) by 0 days.

(21) Appl. No.: 15/075,468

(22) Filed: Mar. 21, 2016

(65) Prior Publication Data
US 2016/0281946 A1    Sep. 29, 2016

(30) Foreign Application Priority Data

Mar. 23, 2015 (FR) ...................... 15 52365

(51) Int. Cl.
*F21S 8/10* (2006.01)
*H05K 1/11* (2006.01)

(52) U.S. Cl.
CPC ......... *F21S 48/1104* (2013.01); *F21S 48/115* (2013.01); *F21S 48/1109* (2013.01); *F21S 48/1159* (2013.01); *F21S 48/212* (2013.01); *F21S 48/215* (2013.01); *F21S 48/321* (2013.01); *F21S 48/328* (2013.01); *H01L 2224/48091* (2013.01); *H05K 1/117* (2013.01); *H05K 2201/10106* (2013.01); *H05K 2203/049* (2013.01)

(58) Field of Classification Search
CPC ... F21S 48/1109; F21S 48/1159; H05K 1/117; H05K 2203/049; H05K 2201/10106
See application file for complete search history.

(56) References Cited

U.S. PATENT DOCUMENTS

| | | | |
|---|---|---|---|
| 6,821,143 B2 | 11/2004 | Gasquet et al. |
| 7,210,833 B2 | 5/2007 | Gasquet et al. |
| 7,829,903 B2 | 11/2010 | Takeda et al. |
| 8,040,676 B2 | 10/2011 | Kluge |

(Continued)

FOREIGN PATENT DOCUMENTS

| | | |
|---|---|---|
| EP | 2306078 A2 | 4/2011 |
| EP | 2327582 A2 | 6/2011 |

(Continued)

*Primary Examiner* — Tracie Y Green
(74) *Attorney, Agent, or Firm* — Jacox, Meckstroth & Jenkins

(57) ABSTRACT

A support for light source(s) for a lighting and/or light signaling module for a motor vehicle, comprising a substrate of thermally conductive material, preferentially of metallic material, at least one light source of the light-emitting or laser diode type with a face for mounting on the substrate, in thermal contact therewith and an electrical power supply circuit for the light source or sources. The power supply circuit is linked electrically with the light source or sources by means of metal wires soldered on the surface by the technology commonly referred to by the expression "wire bonding". The measures of the invention make it possible to define at least one reception plane for the light sources oriented in such a way as to avoid having components in the vicinity of the light sources casting shadows thereon.

17 Claims, 2 Drawing Sheets

(56) References Cited

U.S. PATENT DOCUMENTS

| | | |
|---|---|---|
| 8,297,816 B2 | 10/2012 | Matsumoto et al. |
| 8,633,643 B2 | 1/2014 | Lee et al. |
| 8,851,728 B2 | 10/2014 | Matsumoto et al. |
| 9,111,822 B2 | 8/2015 | Speier |
| 2004/0029436 A1 | 2/2004 | Gasquet et al. |
| 2004/0190294 A1 | 9/2004 | Gasquet et al. |
| 2004/0264195 A1 | 12/2004 | Chang et al. |
| 2006/0197444 A1 | 9/2006 | Takeda et al. |
| 2008/0239675 A1 | 10/2008 | Speier |
| 2009/0086436 A1 | 4/2009 | Kluge |
| 2011/0080092 A1 | 4/2011 | Matsumoto et al. |
| 2011/0127912 A1 | 6/2011 | Lee et al. |
| 2012/0294026 A1 | 11/2012 | Matsumoto et al. |

FOREIGN PATENT DOCUMENTS

| | | |
|---|---|---|
| FR | 2840151 A1 | 11/2003 |
| FR | 2853200 A1 | 10/2004 |
| JP | 2013012347 A | 1/2013 |
| WO | 2006072176 A1 | 7/2006 |
| WO | 2007107601 A2 | 9/2007 |

LED SUPPORT WITH WIRE-BONDED ELECTRICAL CONNECTION FOR A LIGHTING MODULE OF A MOTOR VEHICLE AND ELECTRICAL CONNECTOR BY WIRE-BONDING

CROSS-REFERENCE TO RELATED APPLICATIONS

This application claims priority to the French application 1552365 filed on Mar. 23, 2015, which application is incorporated herein by reference and made a part hereof.

BACKGROUND OF THE INVENTION

1. Field of the Invention

The invention deals with the field of lighting and/or of light signaling, notably for a motor vehicle. More particularly, the invention deals with the field of the mounting and the electrical connection of light sources of the light-emitting diode, LED, type. The invention deals with a support for light source(s) and a module comprising such a support.

2. Description of the Related Art

The use of light sources of light-emitting diode type in lighting and/or light signaling systems is increasingly widespread. In the field of motor vehicle lighting and light signaling, so-called power diodes are used. The latter are often generally planar and of the surface mount type. Surface-mounting of components consists in soldering the components of a board to its surface (SMD, standing for "surface mounted device"), rather than having the leads pass therethrough. Since the light-emitting diodes are semiconductors, they are affected by temperature: the more they heat up, the more their direct junction voltage decreases, and their light yield is degraded. For reasons of reliability and light performance, thermal management measures have to be implemented, in particular for the power modules.

The published patent document FR 2 840 151 A1, which is equivalent to U.S. Publication 2004/0029436 and U.S. Pat. No. 6,821,143, discloses a power light-emitting diode support for a lighting or light signaling system for a motor vehicle. The diode is glued onto a metal substrate forming a heat sink. This substrate is fixed to an electrically insulating plate. It comprises two notches each extending, in opposite directions, from a substrate edge to the edge of the diode. A conductive tab is arranged in each of the two notches in order to ensure an electrical link between the diode and the printed circuit on the plate, the metal substrate ensuring the cooling of the diode. Each of the tabs is linked by soldering to one of the electrodes of the diode. The configuration of this teaching is advantageous inasmuch as it makes it possible to ensure a cooling of the diode while supporting the latter by means of a conventional insulating plate. The cooling capacity is however limited, essentially because of the limited size of the metal substrate. Furthermore, the positioning accuracy is also limited given the addition of the positioning tolerances of the diode relative to the dissipating substrate, of the latter relative to the plate and then of the latter relative to the reflector or to the frame of the lighting or light signaling module.

The published patent document FR 2 853 200 A1, which is equivalent to U.S. Publication 2004/0190294 and U.S. Pat. No. 7,210,833, discloses, similarly to the preceding document, a power light-emitting diode support for a lighting or light signaling system for a motor vehicle. Similarly to the preceding document, the diode is fixed to a metal substrate suitable for dissipating the heat produced by the diode. This substrate is fixed to a plate of electrically insulating material and comprises two opposing notches through which extend, respectively, two electrical connection pins or tabs. Alternatively to the procedure of gluing the diode onto the thermal dissipation substrate disclosed in the preceding document, the diode of this teaching comprises a baseplate composed essentially of copper which is fixed to the substrate by spot laser soldering. These measures are intended to avoid the drawbacks inherent in the use of glue, namely the drying or cross-linking time, the means necessary to its application, its application time and the means for holding the diode on the dissipating substrate until the glue ensures that it is fixed. Similarly to the preceding document, the cooling capacity in this construction is limited, essentially because of the limited size of the metal substrate. Again similarly to the preceding document, the accuracy of positioning of the diode is limited.

It has also been proposed to arrange a plate comprising an electrical power supply circuit on a substrate. One or more light-emitting diodes, glued onto the same generally planar substrate and being able to dissipate the heat produced by the diodes, are connected to the power supply circuit by wire-bonding links. In this case, there is the risk of the elements of the circuit or the plate casting shadow on a part of the light sources or at least on the geometrical location of their light beam, thus reducing their usefulness.

SUMMARY OF THE INVENTION

The aim of the invention is to propose a power light-emitting diode support, notably for a lighting or light signaling system for a motor vehicle, which mitigates at least one of the drawbacks of the devices known from the prior art.

The subject of the invention is a support for light source(s) for a lighting and/or light signaling module for a motor vehicle. The support comprises:
  a substrate thermally conductive material, preferentially of metallic material, the substrate comprising a base;
  at least one semiconductor light source;
  means for connection to an electrical power supply circuit for the light source or sources, the connection means being linked electrically by wire-bonding with the light source or sources by means of metal wires soldered on the surface.

The support is noteworthy in that the substrate comprises at least one structure which protrudes on the base and which defines a reception surface on which at least one of the light sources is arranged in thermal contact.

The base of the substrate can preferably have a generally planar form.

Preferably, the light sources can comprise a light-emitting diode, a power light-emitting diode or a laser diode.

Advantageously, the metal wires can consist of a single metal wire of cylindrical section or a metal tab or even a braid of metal wires.

Preferably, at least one of the reception surfaces can be generally parallel to the plane of the substrate.

At least one of the reception surfaces can advantageously be inclined relative to the plane of the substrate.

At least one of the reception surfaces can preferably have a non-planar geometry, for example a domed geometry.

Optionally, the support can support a number of light sources. If appropriate, the substrate can comprise a number of substrates protruding on the base of the substrate and each defining a reception surface on which at least one of the light sources is arranged in thermal contact. Advantageously, the respective heights of the structures relative to the base can preferably be different.

The power supply circuit can preferentially be supported by the substrate.

The substrate can preferably comprise an electrically insulating surface layer, on which the power supply circuit is formed by electrically conductive metalized tracks.

Preferably, the substrate can be of aluminum, the insulating layer being formed by a substrate ionization procedure or by a deposition of polymer doped with metal particles on the substrate. If appropriate, the metalized tracks can be formed by printing using an ink containing metal particles. Alternatively, the tracks can be are formed by a procedure of molded interconnect device, MID, type.

Alternatively, the power supply circuit can be printed on or in a plate of electrically insulating material arranged on the substrate.

The plate can preferably be generally planar, preferentially it is of solid fiber-reinforced thermosetting resin.

Preferably, the plate can be of molded plastic material molded to the form of the substrate.

Alternatively, the plate can be of flexible plastic material.

Also alternatively, the power supply circuit can comprise a lead frame. Preferably, the lead frame can be offset relative to the base of the substrate.

Preferably, the substrate can comprise two opposite faces each supporting at least one of the light sources. At least one of the two faces can comprise at least one structure which protrudes on the base and which defines a reception surface supporting at least one of the light sources.

The substrate preferably comprises an orifice linking the two faces and arranged facing the plate so as to allow the electrical link with the light source or sources on the face of the substrate opposite to that on which the plate is arranged.

The orifice can preferably be passed through by at least one of the metal wires linked to the face of the plate in contact with the substrate and to the or one of the diodes on the face of the substrate opposite to that on which the plate is arranged.

Advantageously, the orifice can be covered at least partially by a silicone or polymer resin coating. This coating makes it possible to mechanically secure the metal wire in the event of possible vibrations.

The plate can preferably comprise a portion extending through the orifice, the portion comprising at least one electrical contact, one of the metal wires extending from the contact to the or one of the light sources on the face of the substrate opposite to that on which the plate is arranged.

Preferably, the substrate can comprise cooling fins.

The substrate can preferably comprise a first portion forming a wall supporting the light source or sources and a second portion comprising the cooling fins.

The second portion can preferentially be arranged essentially in alignment with the first portion.

Advantageously, the first and second portions of the substrate can be integral with one another.

Preferably, the light source or sources can be glued onto the substrate.

The protruding structure or structures and the substrate can advantageously be integral with one another.

The connections by wire-bonding can preferentially be produced by metal wires of a material chosen from aluminum, copper, gold and silver, the wires being soldered at each end to connection bump contacts having, at least on the surface, a metal layer in the same material.

Another subject of the invention is a support for light source(s) for a lighting and/or light signaling module for a motor vehicle, comprising a substrate, at least one light source connected electrically to a first connection bump contact, a power supply circuit connected electrically to a second connection bump contact, the light source being linked electrically to the power supply circuit by wire-bonding by means of a metal wire linking the first bump contact to the second bump contact.

Preferably, the metal wire can be soldered by its ends to the connection bump contacts, preferentially by ultrasound.

The connection bump contacts can preferably comprise, at least on the surface, a layer of the same material (gold, copper, silver or aluminum) used for the soldered wires. This allows for connections with increased efficiency and durability.

The material of the wire can be aluminum, gold or copper. The diameter of the wire can be between 75 μm and 250 μm.

Another subject of the invention is a procedure intended to make the wire-bonding technology compatible with connection bump contacts, comprising copper for example. The procedure comprises the following steps:

provision of a connection bump contact comprising a sheet which contains copper, or an alloy of copper and steel, the sheet preferentially having a thickness of approximately 0.2 mm to 0.8 mm, the sheet being covered on its bottom face, which is used in the soldering and which contacts the printed circuit, by a thin layer of tin Sn, the thin layer preferably having a thickness of approximately 25 micrometers;

coverage of the top face of the connection bump contact with a layer of aluminum, if aluminum wires are used to produce the wire-bonding, the layer preferably having a thickness of approximately 3.8 micrometers to 10 micrometers;

soldering of the duly prepared connection bump contact wire-bonding wires.

Alternatively, the layer of the top face can be of nickel, or of nickel-phosphorus.

If the wire-bonding wires are of gold or of silver or of copper, the surface layer can preferably be chosen appropriately from the same material.

Preferably, each connection bump contact can have a quadrilateral surface of 1.8×1.8 mm.

This wire-bonding connection procedure is generally applicable to all types of electrical links by wire-bonding on all supports and offers the advantage of making the wire-bonding technology compatible with a plurality of printed circuits, for example flexible printed circuits.

Another subject of the invention is a lighting module for a motor vehicle, comprising:

a support for light source(s);

at least one optical device suitable for deflecting the light rays emitted by the or at least one of the light sources in a lighting beam.

The module is noteworthy in that the support conforms to the invention.

Preferably, the optical device comprises a reflector.

Preferably, the module can comprise a first reflector arranged facing one of the two faces of the substrate, the face supporting at least one of the light sources and a second reflector arranged facing the other of the two faces, the other face supporting at least one of the light sources.

The substrate can preferably comprise cooling fins arranged at the rear of the reflector or reflectors relative to the main direction of the lighting beam.

The measures of the invention are advantageous in that they make it possible to carry out the positioning of the light sources with great accuracy directly on the substrate that acts as frame and reference part. The cooling of the light sources is also optimized. The electrical power supply circuit or circuits can be positioned and fixed with less accuracy than the light sources, notably in proportion to the size of their zones of contact with the metal wires.

The structures protruding from the support and defining reception planes or surfaces for the light sources make it possible to give the latter a specific orientation without requiring other components. Notably, the sources can be raised relative to the power supply circuit in order to avoid any risk of shadow cast by the latter.

The technology of connection by wire-bonding with soldered metal wires, preferentially by ultrasound, makes it possible to then produce the electrical connections simply, reliably, economically and in a manner compatible with the glue link of the light sources. The use of connection bump contacts having, at least on the surface, a layer of the same metal (gold, copper, silver or aluminum) used for the soldered wires allows for connections with increased efficiency and durability. In particular, the provision of a connection bump contact with a surface of gold, copper, silver or aluminum makes it possible to use the wire-bonding technique on flexible printed circuits generally having a layer of copper on the surface. As a variant, the connection can be made via a connection bump contact of nickel or of an alloy of nickel-phosphorus type.

These and other objects and advantages of the invention will be apparent from the following description, the accompanying drawings and the appended claims.

BRIEF DESCRIPTION OF THE ACCOMPANYING DRAWINGS

Other features and advantages of the present invention will be better understood with the aid of the description and drawings in which.

Figure 3:
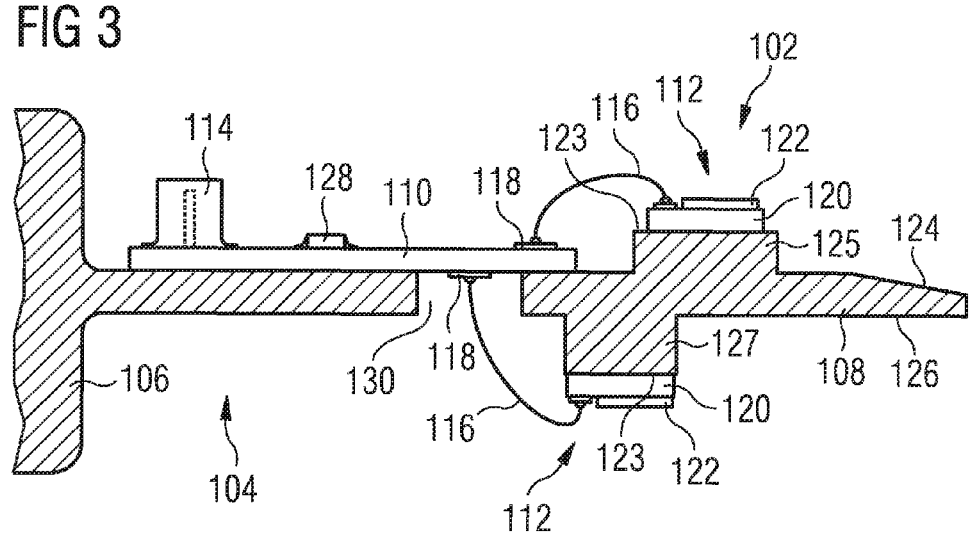
FIG. 3 is a cross-sectional view of a light-emitting or laser diode support, according to a second embodiment of the invention.
Figure 4:
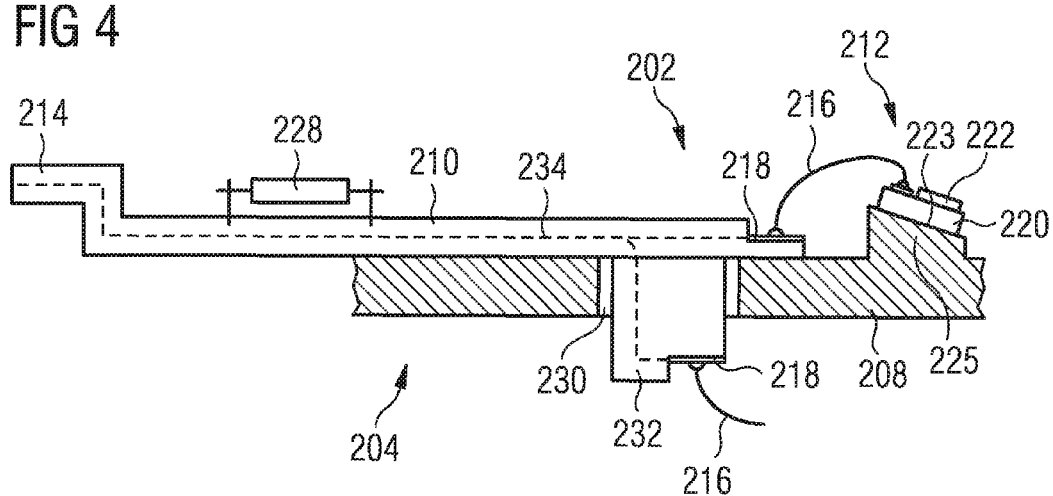
Figure 5:
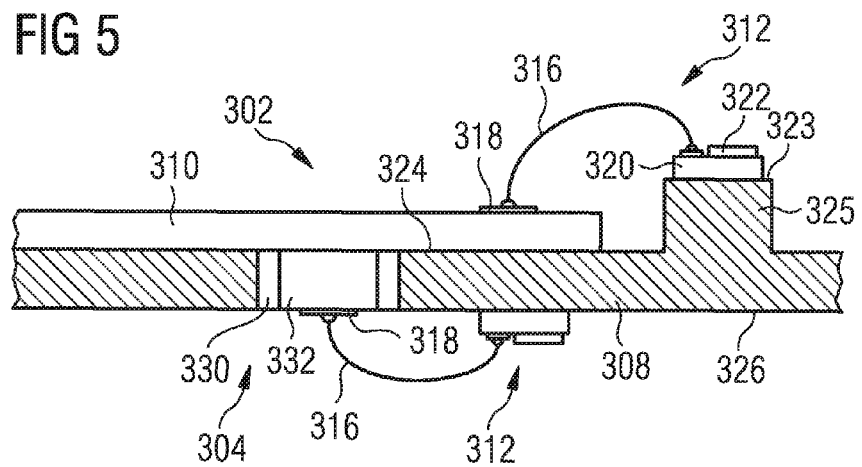

FIG. 4 is a cross-sectional view of a part of a light-emitting or laser diode support, according to a third embodiment of the invention, the part not represented being similar to the support of FIG. 3; and FIG. 5 is a cross-sectional view of a part of a light-emitting or laser diode support, according to a fourth embodiment of the invention, the part not represented being similar to the support of FIG. 3.

DETAILED DESCRIPTION OF THE PREFERRED EMBODIMENTS

Figure 1:
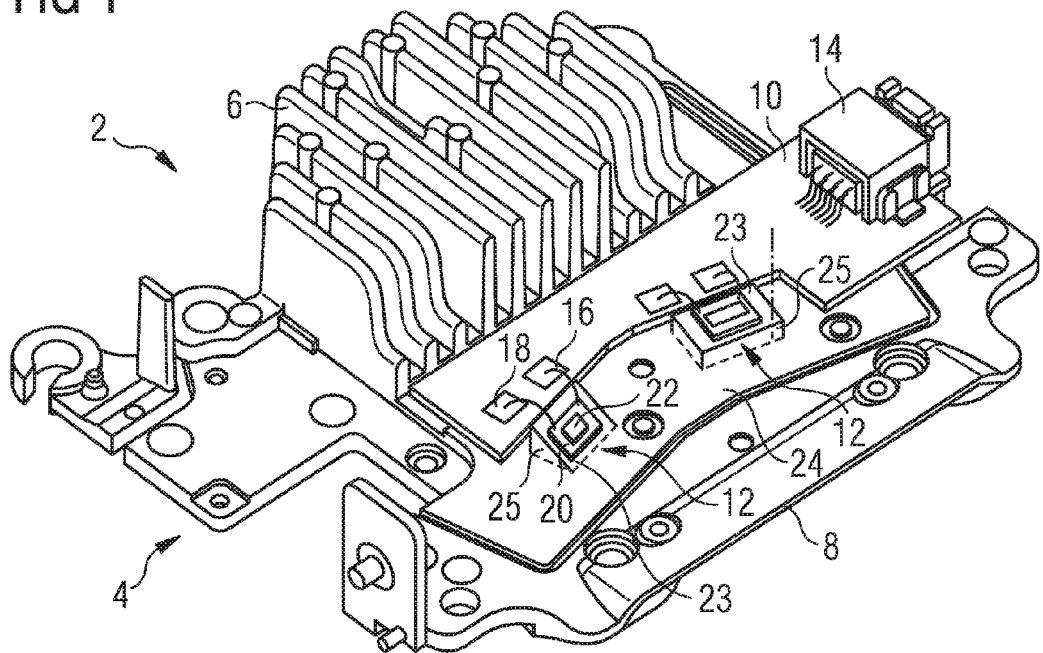
FIG. 1 is a perspective view of a light-emitting or laser diode support, according to a first embodiment of the invention, the view showing the top face of the support.
Figure 2:
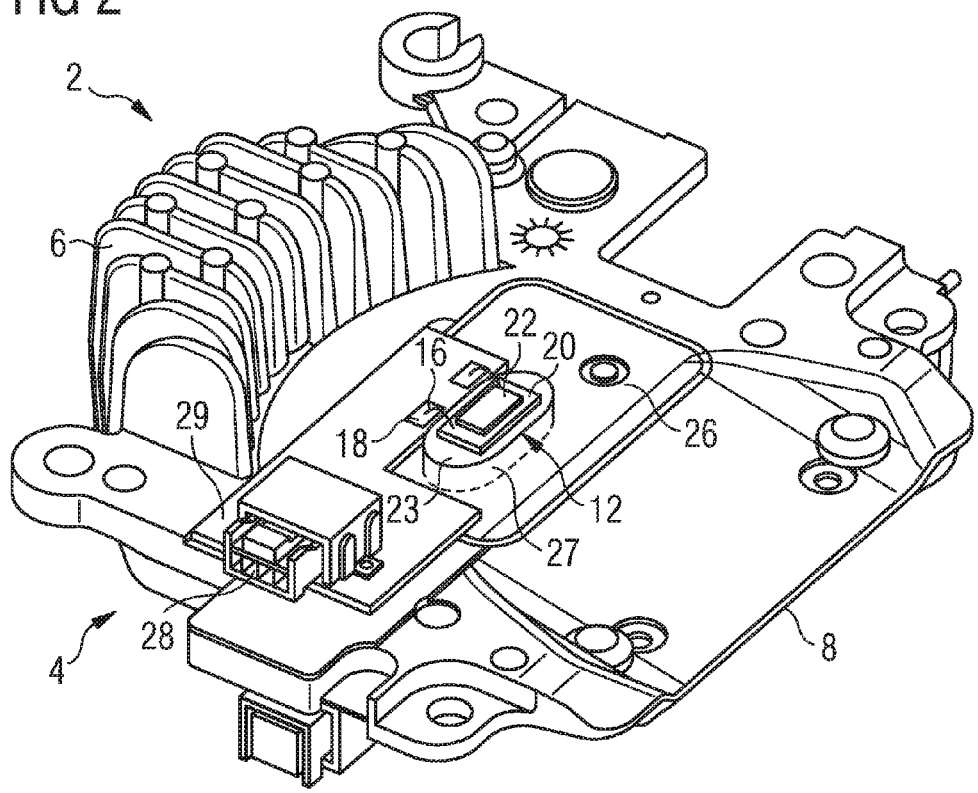
FIG. 2 is a perspective view of the support of FIG. 1, but the view showing the bottom face of the support.

FIGS. 1 and 2 illustrate a first embodiment of the invention. FIG. 1 is a perspective view of the top face of a support 2 for light sources of the light-emitting diode type 12. The support 2 comprises, essentially, a substrate 4 supporting the light-emitting diodes 12. More specifically, the substrate 4 of thermally conductive material, such as, for example, aluminum, comprises a base element or first portion 8 that is generally thin and flat and a second portion 6 forming cooling fins. The first and second portions 6, 8 are preferentially unitary, more preferentially integral with one another. The cooling fins 6 can extend in a direction that is generally transverse, preferentially at right angles, to the mean plane of the base element or first portion 8.

The top face 24 of the base element or first portion 8 comprises one or more structures 25 protruding relative to the generally planar base. Each structure 25 defines a reception or support plane, each of which supports the light-emitting diode 12 in the example shown. These are power diodes, that is to say diodes with a power greater than or equal to 3 watts, suitable for being fixed by their base. They comprise a baseplate 20 and an optical portion 22 on the baseplate 20. The baseplate 20 of the light-emitting diodes 12 is fixed to a reception surface or reception plane 23 of the substrate 4 by means of thermal glue, that is to say by means of a glue exhibiting heat transmission properties. It can be a glue from the company Epotek®. The geometry of the structures 25 can be chosen by deviating from the example shown in FIG. 1. FIG. 1 shows two structures 25. A first structure defines a rectangular reception surface in a plane parallel to the base element or first portion 8 of the substrate 4, but elevated relative thereto, whereas a second structure defines the reception plane 23 that is inclined relative to the base element or first portion 8. Each structure 25 or pedestal can be chosen so as to have a reception surface suitable for supporting a number of light sources or light-emitting diodes 12 without in any way departing from the scope of the invention. Ideally, the structures 25 are of thermally conductive material integral with the base element or first portion 8 of the substrate 4, so as to optimize the dissipation of the heat generated by the light sources or light-emitting diodes 12 supported. The reception surface or plane 23 is sufficiently planar and has a sufficiently large area to be able to receive at least one light source or light-emitting diode 12.

A plate 10 (FIG. 1) covered by a printed electrical circuit (not represented) is also arranged on the essentially flat base element or first portion 8 of the substrate 4. The plate 10 has a profile conforming to the light-emitting diodes 12 so as to run along them at a distance of less than 10 mm, preferentially 5 mm. A connector 14 is arranged on the plate 10 so as to allow it to be powered by a flexible cable (not represented). Contact zones or bump contacts 18 are provided on the plate 10 facing the light-emitting diodes 12, these contact zones or bump contacts 18 being electrically linked to the printed circuit. The light-emitting diodes 12 are linked electrically to the power supply circuit of the plate 10 via metal wires 16 forming bridges between the contact zones or bump contacts 18 of the plate 10 and the corresponding contact zones or bump contacts 18 of the light-emitting diodes 12. These wires 16 are soldered to these contact zones or bump contacts 18 by ultrasound. This is the technology commonly referred to by the expression "wire-bonding", or even by the expression "wiring". It is a technique commonly used to create electrical connections between the housing and the chip of an integrated circuit. The wiring is simply produced by a wire (or bridge) soldered between the two connection bump contacts provided for this purpose on each of the elements. The soldering is generally done by ultrasound. The material of the wire is aluminum, gold or copper. The diameter of the wire can be between 75 µm and 250 µm.

In the case where the invention is used in a lighting device of a motor vehicle, the electrical power supply circuit is used for example to convert a voltage supplied by a battery of the motor vehicle into a load voltage suitable for powering the light source or sources linked to the power supply circuit. Such circuits are known per se in the art and will not be described in more detail in the context of the present invention.

FIG. 2 is a view of the bottom face 26 of the support 2 of FIG. 1. Like the top face 24, the bottom face 26 of the generally thin and flat base element or first portion 8 of the substrate 4 supports the light-emitting diode 12, this light-emitting diode 12 being able to be similar or identical to those situated on the top face 24 of the base element or first portion 8 of the substrate 4. The light-emitting diode 12 is also fixed by gluing by means of a thermal glue onto the reception surface 23 of a structure 27 protruding on the substrate 4, shown by way of example in elliptical form. The reception surface 23 makes it possible, on the one hand, by its elevation relative to the base element or first portion 8, to mitigate the risk of the light-emitting diode 12 receiving shadows cast by neighboring elements. On the other hand, the orientation of the reception surface 23 makes it possible to given an orientation to the light emitted by the light-emitting diode 12. A plate 29 is also fixed onto the bottom face 26 of the base element or first portion 8 of the substrate 4, this plate 29 comprising a circuit (not represented) that is preferentially printed and intended to electrically power the light-emitting diode 12. The contact zones or bump contacts 18 similar to those of the plate 10 of the bottom face 26 are also provided. The electrical link between the circuit of the plate 29 and the light-emitting diode 12 is also provided by soldered wires 16 forming a wire-bond. The plate 29 comprises a connector 28 intended to allow it to be powered from a flexible cable (not represented).

For the two faces 24 and 26, the wires 16 of the electrical link extend in a generally curved way at a distance from the outer surfaces of the light-emitting diodes 12 and of the plate 29. This linking technique consists in applying a first end of a metal wire in contact with a contact zone or bump contact 18 of one of the light-emitting diodes 12 and of the plate 29, and then applying ultrasounds thereto in order to solder it thereon. After soldering, the wire 16 can then be unwound from a tool to then be cut and applied to the second of the two contact zones or bump contacts 18 to be electrically linked. These wires 16 are thus rigidly fixed at their ends to the respective contact zones or bump contacts 18, these rigid links ensuring that the rest of the wire 16 is held in its position as can be seen in FIGS. 1 and 2.

From an assembly procedure and method point of view, the light-emitting diodes 12 are put in place directly on the reception surfaces 23 of the substrate 4 accurately, avoiding any aggregation of tolerances, notably when they are on the support 2 which is itself positioned on the plate 29 which is itself positioned on the substrate 4 serving as reference part. In effect, the substrate 4 comprises means for fixing to a housing (not represented) and is intended to receive the reflectors cooperating with the light-emitting diodes 12. The positioning accuracy can reach a tolerance of up to 30 μm. The plate or plates 29 can be put in place before or after the corresponding light-emitting diode or light-emitting diodes 12 are put in place. The operation of placement of the wire-bonding metal wires 16 is performed after the light-emitting diode or light-emitting diodes 12 and the plate or plates 29 are put in place.

The support 2 illustrated in FIGS. 1 and 2 is intended to form a two-function lighting module. The light-emitting diodes 12 of the top face 24 ensure a first lighting function with horizontal cutoff of the low beam or "dimmed" type. The light-emitting diode 12 of the bottom face 26 forms a beam complementing that of the first function, thus forming a second so-called high beam function, that is to say without horizontal cutoff. A reflector is of parabolic profile and in the form of a half-shell is intended to be arranged on each of the two faces 24 and 26 of the thin and essentially planar base element or first portion 8 of the substrate 4. The substrate 4 thus forms the frame of the lighting module.

FIG. 3 illustrates a second embodiment of the invention. It is a view in longitudinal cross section of a diode support similar to that of the first embodiment. The reference numbers of the first embodiment are used in the second embodiment for the elements that are identical or similar, these numbers being uprated by 100 in order to clearly distinguish the two embodiments. Reference is moreover made for these elements to the corresponding description of the first embodiment. Specific numbers between 100 and 200 have been used for the specific elements.

The support 102 comprises a substrate 104 comprising, like that of FIGS. 1 and 2, the base element or first portion 108 that is generally thin and flat and a second portion 106 forming cooling fins. This embodiment is distinguished from the first in that the support 102 comprises only a single power supply plate 110. The latter extends along the top face 124 of the base element or first portion 108 of the substrate 104, over an orifice 130 passing through the base element or first portion 108. The diode 112 arranged on the bottom face 126 is supported by a pedestal 127 elevated (shown toward the bottom) relative to the generally planar base element or first portion 108 of the substrate 104. This diode 112 is linked electrically to the plate 110 on the top face 124 by means of soldered wires 116 of the wire-bonding type extending from the diode 112 through the orifice 130 to contact zones or bump contacts 118 on the bottom face 126 of the plate 110 facing the orifice 130. The light-emitting diode or light-emitting diodes 112 on the top face 124 are also linked via soldered metal wires 116, similarly to the first embodiment of FIGS. 1 and 2.

The diameter of the orifice 130 is dimensioned to allow for an easy implementation of the soldered metal wires 116. It can be greater than 5 mm, preferentially 10 mm.

This second embodiment makes it possible to reduce the necessary number of power supply plates, more particularly to require only a single plate for two faces of a substrate, which is particularly advantageous.

FIG. 4 illustrates a third embodiment of the invention. It is a view in longitudinal cross section of a diode support 202, like FIG. 3 of the second embodiment. The cross-sectional view is however partial, the rest of the support 202 not represented being similar to that of FIG. 3. The reference numbers of the second embodiment are used in the third embodiment for elements that are identical or similar, these numbers being uprated by 100 in order to clearly distinguish the two embodiments. Reference is moreover made for these elements to the corresponding description of the first embodiment. Specific numbers between 200 and 300 have been used for the specific elements.

The plate 210, instead of being essentially planar as in the first two embodiments of the invention, is in fact a molded plastic element, the form of which conforms to that of the substrate 204. The electrical circuit 234 can moreover be embedded in the plate 210 or else be printed or deposited on its outer surface. A connector 214 can be molded directly with the rest of the plate 210, in the bulk of its material. Components 228 can be provided, notably on the outside of the plate 210 in order to allow their replacement or their selection as a function of various operating parameters. The plate 210 comprises a portion 232 protruding from its inner face and passing through the orifice 230. The electrical circuit 234 can then extend through the orifice 230 in the plastic material of the plate 210, more specifically of the protruding portion 232, to terminate at a contact zone or bump contact 218 in order to ensure an electrical connection with the diode or light source 212 of the corresponding face. The plastic material used for the plate 210 is preferentially a thermoplastic material. It can also be fiber-reinforced. The light source 212 is shown glued onto a structure 225 protruding on the base element or first portion 208 of the substrate 204, and defining a reception plane 223 that is inclined relative thereto.

FIG. 5 illustrates a fourth embodiment of the invention. It is a view in longitudinal cross section of a diode support 302, like FIGS. 3 and 4 of the second and third embodiments, respectively. The cross-sectional view is however partial, the rest of the support 302 not represented being similar to that of FIG. 3. The reference numbers of the third embodiment are used in the fourth embodiment for the elements that are identical or similar, these numbers being uprated by 100 in order to clearly distinguish the two embodiments.

The plate 310 is of a construction similar to the plate 110 of the second embodiment in FIG. 3, apart from the difference that it comprises an addition 332 on its inner face and passing through the orifice 330 of the thin and generally flat base element or first portion 308 of the substrate 304. This addition 332 can be glued onto the inner face of the plate 310, the latter being produced conventionally in fiber-reinforced epoxy resin. The addition element 332 is preferentially of electrically insulating material, such as, for example, a plastic material. An electrical link then has to be provided between the printed circuit on the outer face of the plate 310 and the contact zone or bump contact 318 on the outer face of the addition element 332. The addition element 332 can also be of electrically conductive material, for example of metallic material. In this case, this addition element 332 must have a size smaller than that of the orifice 330 in order to avoid any electrical contact. An insulation on its outer face facing the inner surface of the orifice 330 can be provided. The electrical link between the light-emitting diode or light-emitting diodes 312 and the addition element 332 is similar to that of the preceding embodiments. The same applies for the electrical link between the light-emitting diode or light-emitting diodes 312 of the opposite face and the plate 310. By way of example, a first light source or light-emitting diode 312 is shown glued onto a structure 325 protruding on the first surface 324 of the base element or first portion 308 of the substrate 304, and defining a reception plane 323 elevated relative thereto. A second light source 312 is shown glued directly onto the second surface 326 opposite the base element or first portion 308 of the substrate 304.

In another advantageous embodiment, the power supply circuit according to the invention can be arranged on a flexible printed circuit board, FPCB. Such components are known per se in the art. They generally comprise a flexible film of polymer material, for example of polyamides, covered by a thin layer of copper, for example of a thickness of 15 μm to 35 μm. A circuit is printed by lithography methods that are known per se in the art. The use of the FPCB in the context of the invention offers the advantage of allowing for a more flexible use of the space provided to mount the power supply circuit. However, the electrical connection by wire-bonding and ultrasound soldering of an FPCB to a light-emitting or laser diode 12, 112, 212 or 312 can pose problems. In order to make the wire-bonding technology compatible it is advantageous to prepare the connection zones or bump contacts 18, 118, 218, 318 at the two ends of the wire-bonding link as follows. A sheet comprising copper (or an alloy of copper and of steel) with a thickness of approximately 0.2 mm to 0.8 mm is covered on its bottom face, which is used in the soldering and which contacts the flexible printed circuit board FPCB, by a thin layer of tin Sn, with a thickness of approximately 25 micrometers. The top face of the connection zone or bump contact 18, 118, 218, 318 is covered by a layer of aluminum or of nickel, even of nickel-phosphorus if wires of aluminum are used to produce the wire-bonding. This surface layer has a thickness ranging from approximately 3.8 to 10 micrometers. If the wire-bonding wires are of gold or of silver or of copper, the surface layer of the connection zone or bump contact 18, 118, 218, 318 is chosen appropriately from the same material. Ideally, the connection zone or bump contact 18, 118, 218, 318 extends over a quadrilateral surface of 1.8×1.8 mm. Once the connection zone or bump contact 18, 118, 218, 318 is duly prepared, the wire-bonding wire is soldered thereto, preferably by ultrasound soldering. This method of connection by wire-bonding is generally applicable to all types of electrical links by wire-bonding on all supports 2, 102, 202, 302.

In yet another embodiment, the power supply circuit is directly arranged on a surface of the substrate 4, 104, 204, 304, without the use of a specific support such as a plate 10, 110, 210, 310. Preferably, the surface of the substrate 4, 104, 204, 304, or all of the substrate 4, 104, 204, 304, is of anodized aluminum. A part of the surface is covered by an electrically insulating acrylic resin doped with metal particles suitable for ensuring the bonding of electrical tracks of metallic material on its outer surface.

Electrical tracks can be produced by the technology referred to by the acronym LDS, which stands for Laser Direct Structuring. This involves running a laser ray over the corresponding surface of the substrate 4, 104, 204, 304, following the configuration of the tracks to be produced. The laser ray causes a roughness to be formed that is suitable for promoting the bonding. This step is followed by a metallization by dip coating of the substrate 4, 104, 204, 304 in one or more successive metal baths.

Alternatively, or in a complementary manner, electrical tracks can be produced directly on the anodized surface of the substrate 4, 104, 204, 304 by inkjet-type printing with ink that comprises metal particles.

Alternatively, or in a complementary manner, electrical tracks can be produced directly on the anodized surface of the substrate 4, 104, 204, 304 by inkjet-type printing on a thin PET or PEN sheet which will then be deposited on the support 2, 102, 202, 302 by thermoforming.

In all the embodiments described, the reception surfaces 23, 123, 223, 323 can be used to support more complex electronic set-ups instead of supporting only a light source of light-emitting diode or laser diode type 12, 112, 212, 312. For example, such a sub-set-ups linked by wire-bonding to the power supply circuit can comprise other electronic components, notably ceramic capacitors, thermistors or integrated circuits, depending on the target functionality.

Generally, it is understood that the description which has just been given of the different embodiments is also valid in the case of a reversal of the top faces 24, 124, 224, 324 and bottom faces 26, 126, 226, 326. Technical features shown or described for a specific embodiment can be applied to other embodiments described unless explicitly indicated otherwise.

Still generally, it should be noted that the number of light-emitting diodes 12, 112, 212, 312 represented on the top faces 24, 124, 224, 324 and bottom faces 26, 126, 226, 326 of the portion of the substrate 4, 104, 204, 304 of the different embodiments described hereinabove is purely exemplary, this number being able to vary. Each of the top faces 24, 124, 224, 324 and bottom faces 26, 126, 226, 326 can thus comprise one, two or more than two light-emitting diodes 12, 112, 212, 312 in accordance with the dispositions of these figures.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A support for light source(s) for a lighting and/or light signaling module for a motor vehicle, comprising:
    a substrate of thermally conductive material, preferentially of metallic material, said substrate comprising a base;
    at least one semiconductor light source;
    means for connection to an electrical power supply circuit for said at least one semiconductor light source, said connection means being linked electrically by wire-bonding with said at least one semiconductor light source by means of metal wires soldered on a surface;
    wherein said substrate comprises at least one structure which protrudes on said base and which defines a reception surface on which at least one of said at least one semiconductor light source is arranged in thermal contact;
    wherein said electrical power supply circuit is printed on or in a plate of electrically insulating material arranged on said substrate;
    wherein said substrate comprises two opposite faces each supporting said at least one semiconductor light source, at least one of said two opposite faces comprising at least one structure which protrudes on said base and which defines said reception surface supporting said at least one semiconductor light source, said substrate comprising an orifice linking said two opposite faces and arranged facing said plate so as to allow an electrical link with said at least one semiconductor light source on a face of said substrate opposite to that on which said plate is arranged.

2. The support according to claim 1, wherein at least one of said reception surface is generally parallel to a plane of said substrate.

3. The support according to claim 1, wherein at least one of said reception surface is inclined relative to a plane of said substrate.

4. The support according to claim 1, wherein said electrical power supply circuit is supported by said substrate.

5. The support according to claim 1, wherein said substrate comprises an electrically insulating surface layer, on which said electrical power supply circuit is formed by electrically conductive metalized tracks.

6. The support according to claim 1, wherein said orifice is passed through by at least one of said metal wires linked to a face of said plate in contact with said substrate and to said at least one semiconductor light source on said face of said substrate opposite to that on which said plate is arranged.

7. The support according to claim 1, wherein said plate comprises a portion extending through said orifice, said portion comprising at least one electrical contact, one of said metal wires extending from said at least one electrical contact to said at least one semiconductor light source on said face of said substrate opposite to that on which said plate is arranged.

8. The support according to claim 1, wherein said substrate comprises cooling fins.

9. The support according to claim 8, wherein said substrate comprises a first portion forming a wall supporting said at least one semiconductor light source and a second portion comprising said cooling fins.

10. The support according to claim 1, wherein said at least one semiconductor light source are glued onto said substrate.

11. The support according to claim 2, wherein said substrate comprises an electrically insulating surface layer, on which said electrical power supply circuit is formed by electrically conductive metalized tracks.

12. The support according to claim 3, wherein said substrate comprises an electrically insulating surface layer, on which said electrical power supply circuit is formed by electrically conductive metalized tracks.

13. The support according to claim 2, wherein said electrical power supply circuit is printed on or in a plate of electrically insulating material arranged on said substrate.

14. The support according to claim 3, wherein said electrical power supply circuit is printed on or in a plate of electrically insulating material arranged on said substrate.

15. A support for light source(s) for a lighting and/or light signaling module for a motor vehicle, comprising:
    a substrate of thermally conductive material, preferentially of metallic material, said substrate comprising a base;
    at least one semiconductor light source;
    a connector for connecting an electrical power supply circuit for said at least one semiconductor light source, said connector being linked electrically by wire-bonding with said at least one semiconductor light source by means of metal wires soldered on a surface;
    wherein said substrate comprises at least one structure which protrudes on said base and which defines a reception surface on which at least one of said at least one semiconductor light source is arranged in thermal contact,
    wherein said electrical power supply circuit is printed on or in a plate of electrically insulating material arranged on said substrate;
    wherein said substrate comprises two opposite faces each supporting said at least one semiconductor light source, at least one of said two opposite faces comprising at least one structure which protrudes on said base and which defines said reception surface supporting said at least one semiconductor light source, said substrate comprising an orifice linking said two opposite faces and arranged facing said plate so as to allow an electrical link with said at least one semiconductor light source on a face of said substrate opposite to that on which said plate is arranged.

16. A lighting module for a motor vehicle, comprising;
    a support for at least one light source;
    at least one optical device suitable for deflecting light rays emitted by at least one light source in a lighting beam;
    wherein said support comprises;
        a substrate of thermally conductive material, preferentially of metallic material, said substrate comprising a base;
        at least one semiconductor light source;
        means for connection to an electrical power supply circuit for said at least one semiconductor light source, said connection means being linked electrically by wire-bonding with said at least one semiconductor light source by means of metal wires soldered on a surface;

wherein said substrate comprises at least one structure which protrudes on said base and which defines a reception surface on which at least one of said at least one semiconductor light source is arranged in thermal contact wherein said lighting module comprises a first reflector arranged facing a first face of said substrate, said first face supporting at least one of said at least one semiconductor light source and a second reflector arranged facing a second face, said second face supporting said at least one semiconductor light source.

17. The lighting module according to claim 16, wherein said substrate comprises cooling fins arranged at a rear of a reflector or reflectors relative to a main direction of a lighting beam.

* * * * *